United States Patent
Tan et al.

(10) Patent No.: US 7,463,080 B2
(45) Date of Patent: Dec. 9, 2008

(54) METHODS AND SYSTEMS FOR CONVERTING A SINGLE-ENDED SIGNAL TO A DIFFERENTIAL SIGNAL

(75) Inventors: Qingsheng Tan, Hillsboro, OR (US); Taylor Tan, Beijing (CN)

(73) Assignee: Maxim Integrated Products, Inc., Sunnyvale, CA (US)

( * ) Notice: Subject to any disclaimer, the term of this patent is extended or adjusted under 35 U.S.C. 154(b) by 39 days.

(21) Appl. No.: 11/784,293

(22) Filed: Apr. 6, 2007

(65) Prior Publication Data

US 2008/0246527 A1    Oct. 9, 2008

(51) Int. Cl.
*H03M 1/12* (2006.01)
*H03K 17/62* (2006.01)

(52) U.S. Cl. .................................. 327/415; 341/155
(58) Field of Classification Search ............... 327/307, 327/100, 415; 341/155, 156
See application file for complete search history.

(56) References Cited

U.S. PATENT DOCUMENTS 5,666,961 A * 9/1997 McFarlin, Sr. .............. 600/534
6,836,163 B2 * 12/2004 Spehar ....................... 327/141
6,863,298 B2 * 3/2005 Sakai et al. ............... 280/728.1

* cited by examiner

*Primary Examiner*—Dinh T. Le
(74) *Attorney, Agent, or Firm*—Perkins Coie LLP

(57) ABSTRACT

Methods and systems are described for converting single-ended signals to differential signals. In one exemplary embodiment, an input single-ended signal is received and converted into a differential signal having minimized jitter without using a DC-cancellation loop.

24 Claims, 5 Drawing Sheets

METHODS AND SYSTEMS FOR CONVERTING A SINGLE-ENDED SIGNAL TO A DIFFERENTIAL SIGNAL

BACKGROUND

Many of today's industrial as well as personal electronic equipment rely on microcontrollers or digital signal processors ("DSP") to process real world, analog signals. For example, sensors can be used to convert a natural parameter such as temperature or pressure into a voltage or current. Analog-to-digital converter ("ADC") can then transform the signals into a digital format. Typically, an ADC converts an input analog voltage to discrete digital values and a number of ADC input formats exist including single-ended and differential inputs.

Single-ended signaling is a widely used technique and is the simplest method for transmitting electrical signals over wires. In single-ended applications, one wire carries a varying voltage that represents the signal, while another wire is connected to a reference voltage, usually ground. The primary advantage of using single-ended inputs is that a minimal number of wires are needed to transmit multiple signals. While single-ended inputs may be ideal where the signal source and ADC are close to each other, such inputs are more susceptible to coupled-noise and DC offsets. Differential signaling, on the other hand, is a method for transmitting information over pairs of wires. In differential applications, two wires are routed in parallel, and sometimes twisted together so that both wires receive the same interference. In this configuration, one wire carries the signal while the second wire carries the inverse of the signal. Advantages of differential signaling include noise reduction by rejecting common-mode interference and greater dynamic range.

Depending on the nature of an application, single-ended signaling may be more appropriate than differential signaling and vice versa. For example, an application sensitive to noise may necessitate the use of differential signals. Some applications, however, lack signals preconditioned for differential operation and a single-ended-to-differential conversion stage is required.

To maintain a low pulse-width distortion for a low deterministic jitter, existing single-ended-to differential conversion methods employ a DC-cancellation loop to set up a decision threshold at 50% of the single-ended input data transition. The DC-cancellation loop introduces a time constant for stabilizing the decision threshold. While systems including DC-cancellation loops can be used for continuous-mode and balanced data transmission, they are inadequate for some applications. In a burst-mode application, for example, valid differential data must be established within very limited unit interval counts (e.g., the symbol duration time) and the decision threshold has to be maintained over an extended sequence of data stream. Moreover, for un-balanced data transmission such as 4B/5B coding, the conventional DC-cancellation technique would introduce a pulse-width distortion at the differential output, which would then drain the system jitter margin. Accordingly, there is a need for converting single-ended signals to differential signals without using a DC-cancellation loop.

SUMMARY

Systems and methods are present herein for converting single-ended signals to differential signals without a DC-cancellation loop. In one embodiment of the invention, an input single-ended signal is delayed to generate a delayed signal. The input signal and the delayed signal are then used to generate differential output signals having the same baseline. The differential signals are subsequently fed into a signal quantization branch and a select window branch. The signal quantization branch receives the differential signals as input and outputs a pair of quantized differential outputs whereas the select window branch receives the differential signals and outputs a pair of edge selection signals. The quantized differential outputs and the edge selection signals are then used to generate edge trigger signals which in turn are used to recover the input single-edged signal as a differential signal with a minimized jitter at the rising and falling edges.

BRIEF DESCRIPTION OF THE DRAWINGS

Embodiments of the invention are illustrated in the Figures. However, the embodiments and Figures are illustrative rather than limiting; they provide examples of the invention.

DETAILED DESCRIPTION

In the following description, several specific details are presented to provide a thorough understanding of embodiments of the invention. One skilled in the relevant art will recognize, however, that the invention can be practiced without one or more of the specific details, or in combination with other components, etc. In other instances, well-known implementations or operations are not shown or described in detail to avoid obscuring aspects of various embodiments of the invention.

Figure 1:
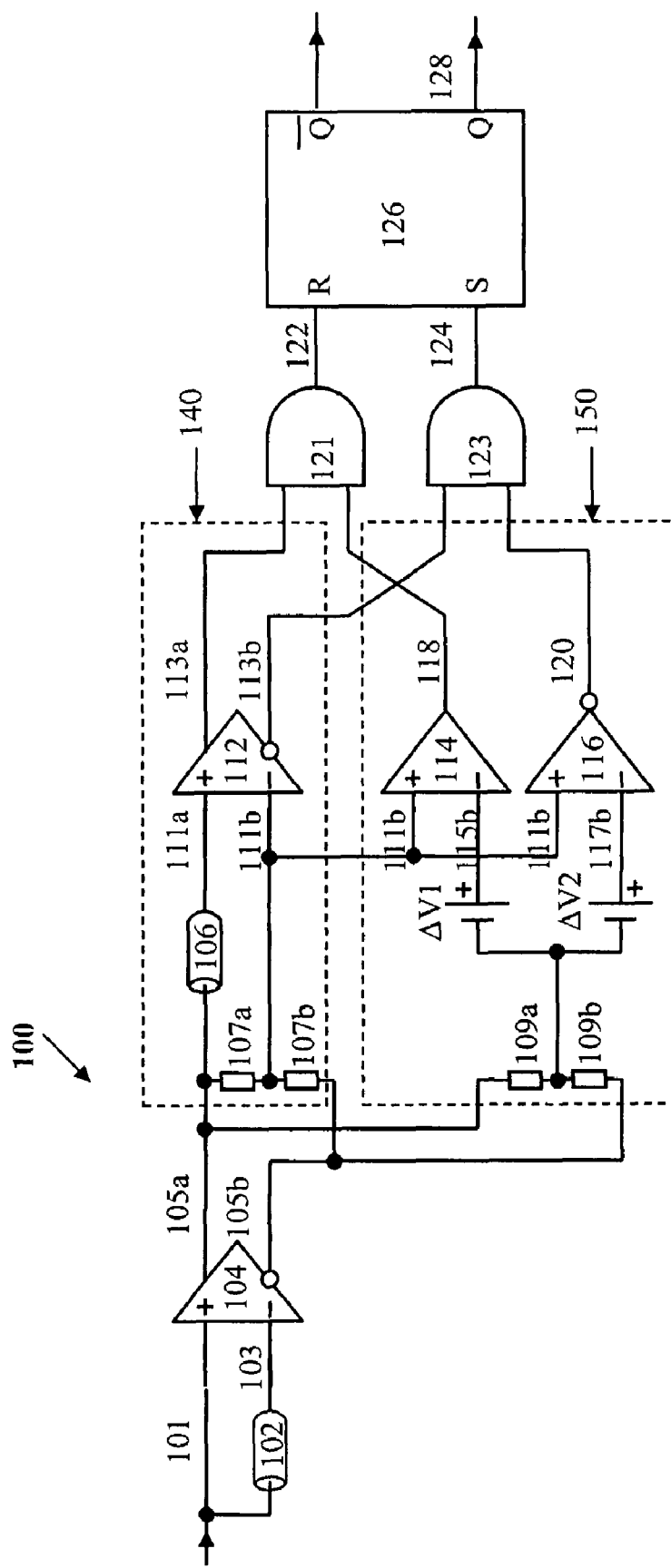
FIG. 1 is a schematic diagram of a circuit system for converting single-ended signals to differential signals.

FIG. 1 depicts a schematic diagram of a circuit design for converting single-ended signals to differential signals. The circuit system 100 receives an input signal 101 and outputs a differential signal 128. The input signal 101 is a single-ended signal received from one or more known application sources including but not limited to a transimpedance amplifier for outputting a single-ended voltage.

Figure 2:
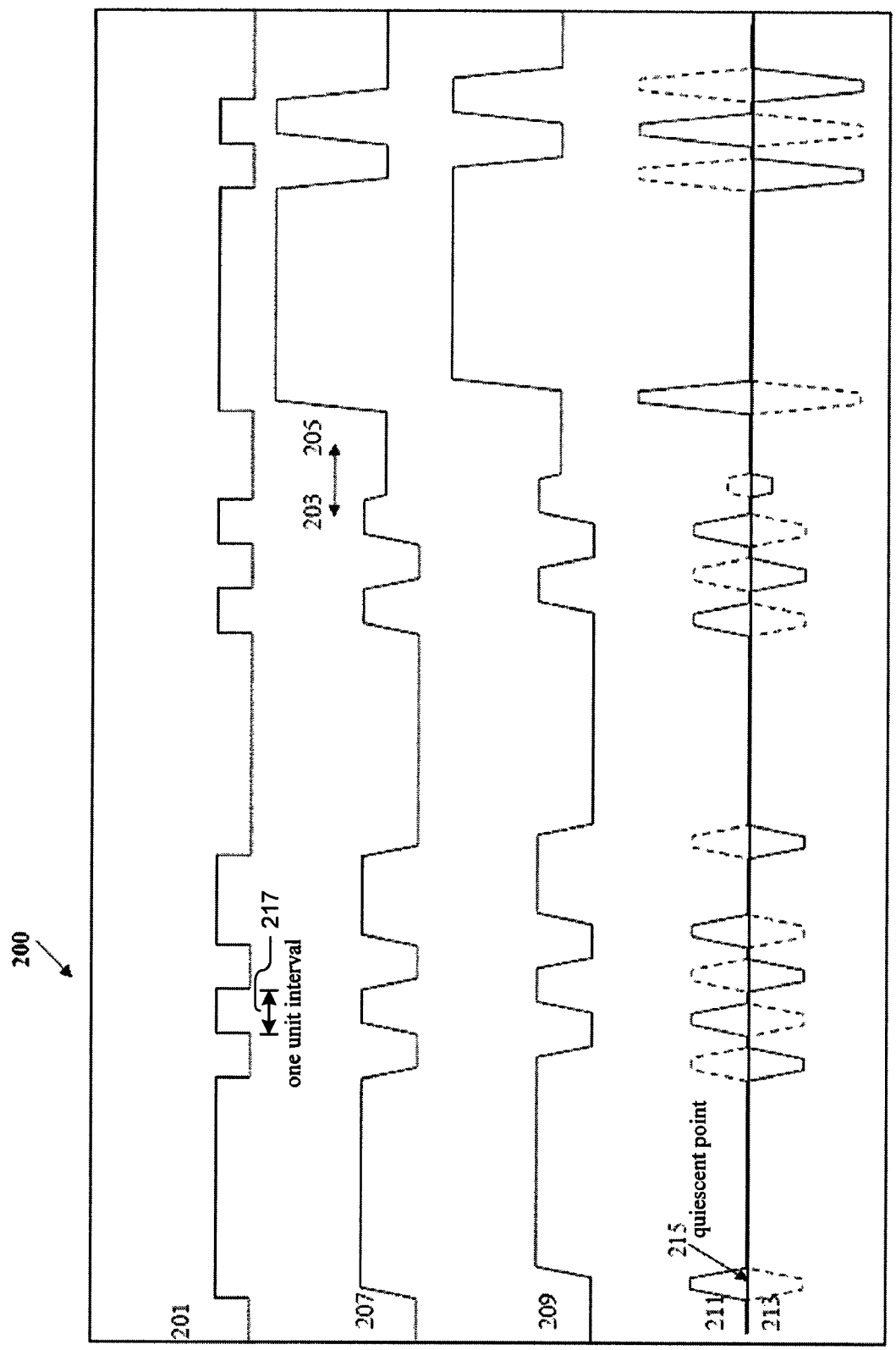
FIG. 2 is a diagram of waveforms for data stream, input, and intermediate signals in a circuit system for converting single-ended signals to differential signals.

FIG. 2 is a diagram 200 of waveforms for data stream, input, and intermediate signals in a circuit system for converting single-ended signals to differential signals. The waveforms in FIG. 2 illustrate a burst-mode application where a first burst denoted 203 is followed by a second burst denoted 205 having a higher amplitude, corresponding to a data stream 201. In other embodiments, alternative types of application may be employed including but not limited to other non-continuous mode or unbalanced data transmissions. Further, the exemplary waveforms 207, 209, 211, and 213 correspond to the signals 101, 103, 105a, and 105b respectively.

As shown in FIG. 1, the input signal 101 is delayed by the delay cell 102 to generate a delayed signal 103. In one embodiment, the delay applied to the input signal 101 is approximately ¾ of the unit-interval (e.g., the symbol duration time) of the operating data rate. For example, the delay is approximately 600 ps for an 1.25 Gbps application, where one unit interval is approximately 800 ps. In alternative embodiments, the delay interval may vary provided the delayed signal reaches its stable level within the time window in which the input signal reaches a stable level after a 0 to 1 or 1 to 0 transition. In the example 200 of FIG. 2, the waveforms 207 and 209 corresponding to the signals 101 and 103 respectively show a delay between the two waveforms by approximately ¾ of one unit interval 217. Since the signals 101 and 103 originate from the same source, it is important to note that the waveforms 207 and 209 corresponding to the signals 101 and 103 have similar shapes with a time domain shift due to the delay.

The exemplary circuit 100 in FIG. 1 feeds the input signal 101 and delayed signal 103 to a differential amplifier 104 to generate a pair of differential outputs lO5a and 105b. In one embodiment, the amplifier 104 is a linear amplifier having a gain that is symmetric to the voltage level at bias point (e.g., the quiescent point). The symmetrical nature of the differential amplifier ensures that the differential outputs lO5a an 105b share a same quiescent voltage, also referred to as the common mode voltage (i.e. baseline voltage level). In alternative embodiments, other factors may be considered in designing the amplifier 104 including but not limited to an application's jitter tolerance. Because the input signals 101 and 103 to the amplifier 104 originate from the same source, the amplifier 104 subtracts the DC component to generate outputs lO5a and 105b having the same voltage level at quiescent point with a phase-reversed AC component. The waveforms 211 and 213 illustrate the signals lO5a and 105b as sharing quiescent point 215 with a phase-reversed AC component represented by a solid line for waveform 211 and a dotted line for waveform 213. It is noted that each of the signal tail for the signals lO5a and 105b returns to the the voltage level at the quiescent point 215 after each pulse and the signals lO5a and 105b always have the same quiescent point 215, regardless of the amplitude and extinction ratio.

The signal 105a and 105 b then serve as input to the signal quantization branch 140 and the edge select window branch 150. The signal quantization branch 140 comprises a delay line 106, two resistors 107a and 107b between signals 105a and 105b, and a comparator 112. In one embodiment, the delay interval of the delay line 106 is set as approximately ¼ of one unit interval. In other embodiments, the delay interval for delay line 106 may be adjusted such that the top and bottom of the waveform for the output delayed signal 111a intersects the waveform for the signal 111b at 50% of the rising and falling edges respectively, as illustrated by waveforms 301 and 303 in FIG. 3. The delay line 106 interval value is set so that the signal jitter of signals 113a and 113b are minimized. In one embodiment, the comparator 112 is implemented with a limiting amplifier. Moreover, the resistance value of resistor 107a is ⅓ the resistance value of resistor 107b so that the voltage at the joint node of the two resistors, denoted as 111b, would have the same baseline as that of signal 111a but with half the amplitude of signal 111a.

Figure 3:
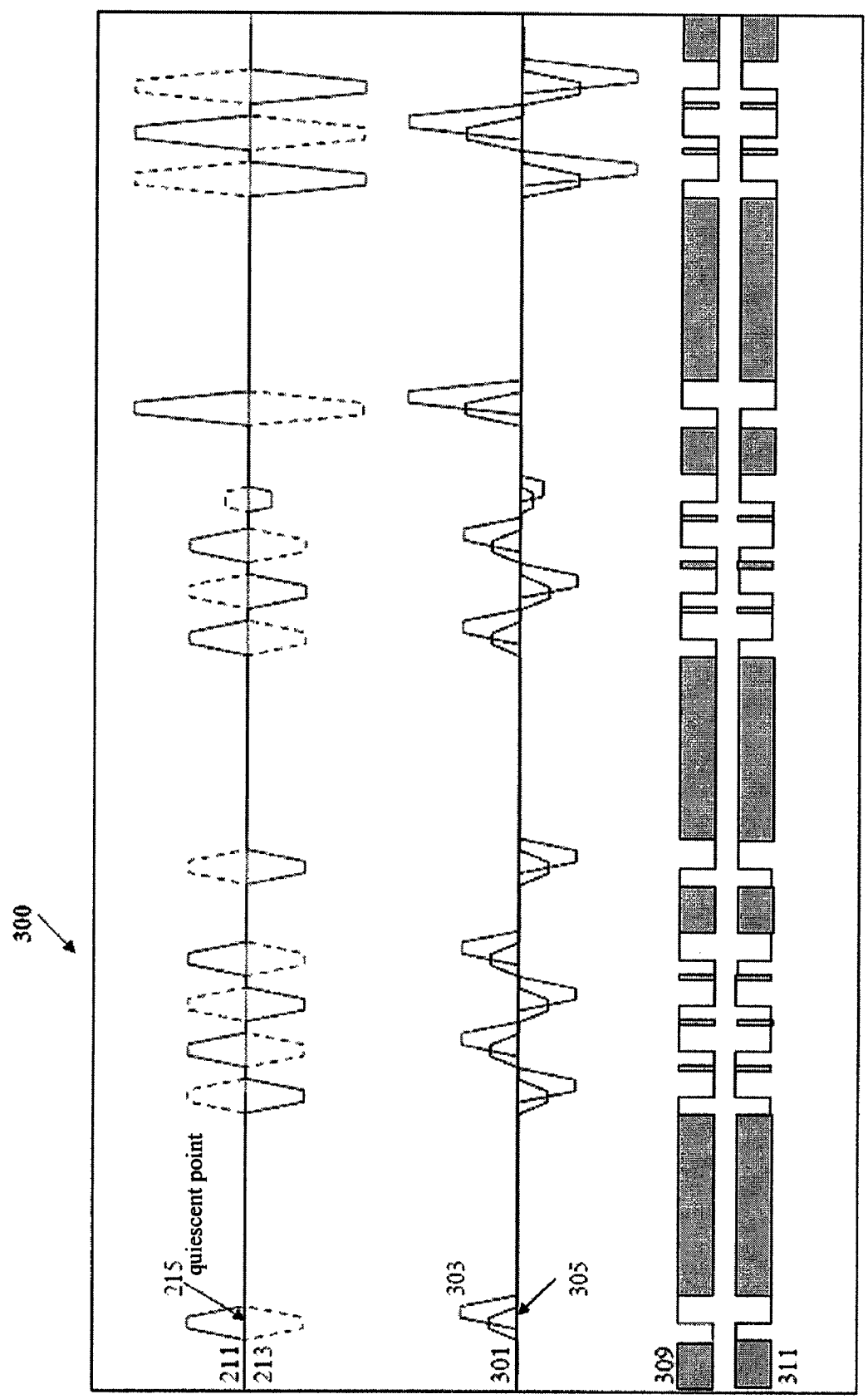
FIG. 3 is a diagram of waveforms for intermediate signals in a circuit system for converting single-ended signals to differential signals.

FIG. 3 is a diagram 300 of waveforms for intermediate signals. Specifically, the waveforms 211, 213, 301, 303, 309 and 311 correspond to the signals 105a, 105b, 111b, 111a, 113a, and 113b respectively. As illustrated by waveforms 301 and 303, the delay line 106 and the resistors 107a and 107b are configured such that the top or bottom of the waveform for the signal 111b intersect the waveform for the signals 111a at approximately 50% of the rising or falling edge of the signal 111a, respectively. The relationship between the signals 111a and 111b remains constant regardless of the swing of the input signal. Consequently, signal 111b serves as a decision threshold for generating a minimized pulse width distortion. As shown in FIG. 1, the signals 111a and 111b are fed as input to comparator 112 which in turn generates differential outputs 113a and 113b. The waveforms 309 and 311 for the signals 113a and 113b comprise undefined states (shown as grey areas) as well as precision signal edges from which the rising and falling edges of the recovered signal denoted 128 will be selected.

Figure 4:
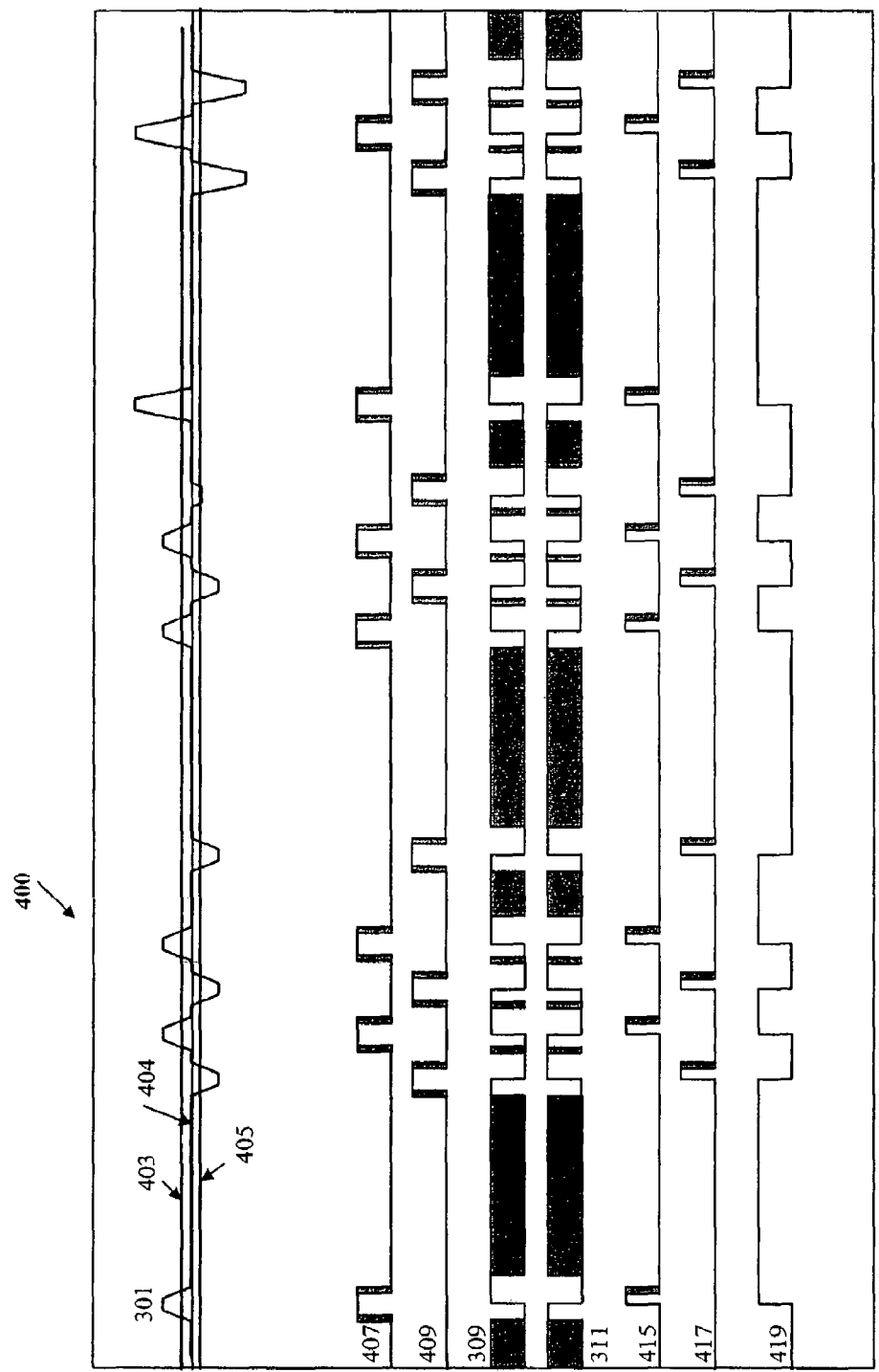
FIG. 4 is a diagram of waveforms for intermediate and output signals in a circuit system for converting single-ended signals to differential signals.

The select window branch 150 comprises two resistors 109a and 109b and two comparators 114 and 116. In one embodiment, the resistors 109a and 109b have the same resistance. In one embodiment, the comparators 114 and 116 are implemented with limiting amplifiers. FIG. 4 is a diagram 400 of waveforms for intermediate and output signals. Specifically, the waveforms 301, 403, 405, 407, 409, 309, 311, 415, 417, and 419 correspond to the signals 111b, 115b, 117b, 118, 120, 113a, 113b, 122, 124, and 128 respectively. In one embodiment, the voltage at the joint node of the resistors 109a and 109b have the same baseline signal denoted 404 in FIG. 4 as the signal 111b. Moreover, in one embodiment, the two DC offset signals $\Delta V1$ (>0) and $\Delta V2$ (<0), having the same amplitude but reversed polarity, form a decision threshold for signal 111b with signals 115b and 117b. As illustrated by waveforms 301, 403, and 405 corresponding to signals 111b, 115b, and 117b, the signals 115b and 117b have the same amplitude with reverse polarity and share the same baseline 404 as that of signal 111b. In one embodiment, the offset voltage may be set as a fraction of the smallest amplitude for the signal 111b. The signals 111b, 115b, and 117b are fed as input to comparators 114 and 116 to generate signals 118 and 120 having waveforms 407 and 409, respectively. Although the waveforms 407 and 409 do not have well defined rising and falling edges, these edges do not affect the jitter for the recovered signal 128 provided that the precision signal edges (i.e. well-defined edges) of the waveforms 309 and 311 for signals 113a and 113b fall within the open windows of the waveforms 407 and 409.

As shown in FIG. 1, the signals 113a and 118 are fed as input to an AND gate 121 to generate signal 122 and the signals 113b and 120 are fed as input to an AND gate 123 to generate signal 124. In one embodiment, the signals 122 and 124 are used to drive a R-S latch 126 in order to recover the original input signal as output differentia signal 128 with a corresponding waveform 419 as shown in FIG. 4. In alternative embodiments, the latch 126 may be implemented with other memory elements including but not limited to a flip flop. As shown in FIG. 4, the precision edges of the waveform 415 corresponding to the signal 122 operate as the rising edge triggers for the output signal 128 corresponding to waveform 419. Similarly, FIG. 4 shows that the precisions edges of the waveform 417 corresponding to the signal 124 serve as the falling edge trigger for the output signal 128 corresponding to waveform 419. Moreover, since the latch 126 is triggered by the precisions edges of the waveforms 415 and 417, the output signal 128 has a minimized jitter at both the rising and the falling edges.

Figure 5:
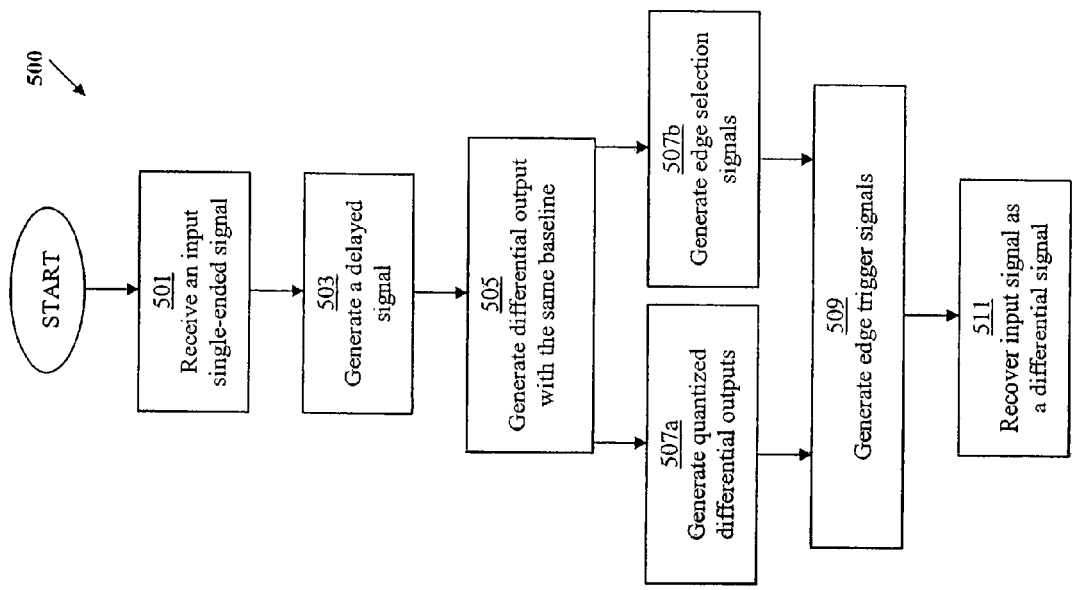
FIG. 5 is a flowchart of a method for converting single-ended signals to differential signals.

FIG. 5 is a flowchart of a method for converting single-ended signals to differential signals. In an embodiment, the flowchart 500 starts at module 501 where an input singled-ended signal is received. In one embodiment, the input signal is received from one or more known application sources including but not limited to a transimpedance amplifier for outputting single-ended voltage.

In the example of FIG. 5, the flowchart 500 continues to module 503 where the input single-ended signal is delayed to generate a delayed signal. In one embodiment, the delay interval applied is approximately ¾ of the unit-interval of the highest operating data rate. In the example of FIG. 5, the flowchart 500 then continues to module 505 where the input signal and the delayed signal are used to generate a pair of differential output signals having the same baseline. In one embodiment, a linear amplifier having a gain that is symmetric to the common mode voltage receives the input signal and the delayed signal and outputs the differential pair of signals having the same baseline.

In one embodiment, the flowchart 500 continues to modules 507a and 507b simultaneous where quantized differential output signals edge selection signals are generated respectively. In module 507a, the differential output signals generated in module 505 are fed into a signal quantization branch that generates a pair of signals having undefined states and precision signal edges. Moreover, the precision signal edges of the output signals from the signal quantization branch determine the rising and falling edges of the output differential signal from which the original input signal in module 501 is converted. In module 507b, the differential output signals generated in module 505 are fed into a select window branch that generates a pair of signals for selecting the open windows of the output differential signal from which the original input signal in module 501 is converted.

In the example of FIG. 5, the flowchart 500 continues to module 509 where the output signals in the modules 507a and 507b are used to generate edge trigger signals for recovering the input signal received in module 501. In one embodiment, the flowchart 500 continues to module 511 where the input singled-ended signal of module 501 is recovered as a differential signal using the edge trigger signals generated in module 509.

While this invention has been described by way of example in terms of certain embodiments, it will be appreciated by those skilled in the art that certain modifications, permutations and equivalents thereof are within the inventive scope of the present invention. It is therefore intended that the following appended claims include all such modifications, permutations and equivalents as fall within the true spirit and scope of the present invention; the invention is limited only by the claims.

The invention claimed is:

1. A circuit for converting single-ended signals to differential signals, comprising:
   a first delay line for generating a delayed signal from an input single-ended signal;
   an amplifier for receiving the input single-ended signal and the delayed signal to generate a pair of differential output signals;
   a signal quantization module for receiving the pair of differential output signals to generate a pair of quantized differential signals;
   a select window module for receiving the pair of differential output signals to generate a pair of edge selection signals;
   an edge trigger generator for receiving the quantized differential outputs and the edge selection signals to generate a pair of edge trigger signals; and
   a memory element for receiving the edge trigger signals to generate an output differential signal.

2. The circuit of claim 1, wherein the amplifier is a differential amplifier.

3. The circuit of claim 1, wherein the amplifier is a linear amplifier.

4. The circuit of claim 1, wherein the delay interval for the first delay line is approximately ¾ of a unit-interval of an operating data rate.

5. The circuit of claim 1, wherein the pair of differential output signals have the same voltage level at quiescent point.

6. The circuit of claim 1, wherein the signal quantization module further comprises:
   a first resistor;
   a second resistor coupled to the first resistor;
   a second delay line coupled to the first resistor; and
   a comparator whose input is coupled to the output of the second delay line and a joint node of the first and the second resistors, wherein the comparator outputs the pair of quantized differential signals.

7. The circuit of claim 6, wherein the delay value of the second delay line is approximately ¼ of one unit interval.

8. The circuit of claim 6, wherein the voltage at the joint node of the first and the second resistor has the same voltage level at quiescent point and half the amplitude as the output of the second delay line.

9. The circuit of claim 6, wherein the comparator is a limiting amplifier.

10. The circuit of claim 6, wherein the select window module further comprises:
    a third resistor;
    a fourth resistor coupled to the third resistor;
    a first DC offset applied to the joint node of the third and the fourth resistor to generate a first decision threshold signal;
    a second DC offset applied to the joint node of the third and the fourth resistor to generate a second decision threshold signal;
    a first comparator that receives as input the first decision threshold signal and the signal at the joint node of the first and the second resistor, wherein the first comparator outputs a first edge selection signal of the pair of edge selection signals; and
    a second comparator that receives as input the second decision threshold signal and the signal at the joint node of the first and the second resistor, wherein the second comparator outputs a second edge selection signal of the pair of edge selection signals.

11. The circuit of claim 10, wherein the first and the second threshold signals have the same amplitude with reverse polarity.

12. The circuit of claim 10, wherein the first and the second threshold signals have the same voltage level at quiescent point as the signal at the joint node of the first and the second resistor.

13. The circuit of claim 10, wherein the first and second comparators are limiting amplifiers.

14. The circuit of claim 1, wherein the edge trigger generator further comprises:
    a first AND gate for receiving as input a first quantized differential signal of the pair of quantized differential signals and the first edge selection signal; and
    a second AND gate for receiving as input a second quantized differential signal of the pair of quantized differential signals and the second edge selection signal.

15. The circuit of claim 1, wherein the memory element is a R-S latch.

16. The circuit of claim 1, wherein the memory element is a flip flop.

17. A method, comprising
    receiving an input single-ended signal;
    generating a delayed signal from the input single-ended signal;
    generating a pair of differential signals using the input single-ended signal and the delayed signal;
    generating a pair of quantized differential signals using the pair of differential signals;

generating a pair of edge selection signals using the pair of differential signals;

generating a pair of edge trigger signals using the quantized differential signals and the edge selection signals; and generating an output differential signals using the edge trigger signals.

18. The method of claim 17, wherein the generating a pair of quantized differential signals steps further comprising:

generating a first signal and a second signal wherein the two signals share a same voltage level at quiescent point and the second signal having half the amplitude as that of the first signal; and generating the pair of quantized differential signals from the first and the second signal.

19. The method of claim 18, wherein the generating a pair of edge selection signals step further comprising:

generating a third signal and a fourth signal wherein the two signals share a same voltage level at quiescent point and have the same amplitude with reverse polarity; and generating the pair of edge selection signals from second, third, and fourth signals.

20. The method of claim 17, wherein a first signal of the pair of edge trigger signals is generated by ANDing a first signal of the pair of quantized differential signals with a first signal of the pair of edge selection signals, and a second signal of the pair of edge trigger signals is generated by ANDing a second signal of the pair of quantized differential signals with a second signal of the pair of edge selection signals.

21. A circuit for converting single-ended signals to differential signals, comprising:

a first delay line for generating a delayed signal from an input single-ended signal;

an amplifier for receiving the input single-ended signal and the delayed signal to generate a pair of differential output signals;

a first resistor coupled to a first output of the amplifier;

a second resistor coupled to the first resistor and to a second output of the amplifier;

a second delay line coupled to the first resistor;

a first comparator that receives as input the output of the second delay line and a joint node of the first and the second resistors, wherein the first comparator outputs a pair of quantized differential signals;

a third resistor coupled to the first output of the amplifier;

a fourth resistor coupled to the third resistor and to the second output of the amplifier;

a first DC offset applied to the joint node of the third and the fourth resistor to generate a first decision threshold signal;

a second DC offset applied to the joint node of the third and the fourth resistor to generate a second decision threshold signal;

a second comparator that receives as input the first decision threshold signal and the signal at the joint node of the first and the second resistor, wherein the second comparator outputs a first edge selection signal; and a third comparator that receives as input the second decision threshold signal and the signal at the joint node of the first and the second resistor, wherein the third comparator outputs a second edge selection signal.

22. The circuit of claim 21, further comprising:

a first AND gate for receiving as input a first quantized differential signal of the pair of quantized differential signals and the first edge selection signal; and a second AND gate for receiving as input a second quantized differential signal of the pair of quantized differential signals and the second edge selection signal.

23. The circuit of claim 22, wherein the first and second AND gates generate a first and a second edge trigger signal, respectively.

24. The circuit of claim 23, further comprising a memory element for receiving the edge trigger signals to generate an output differential signal.

* * * * *

UNITED STATES PATENT AND TRADEMARK OFFICE
CERTIFICATE OF CORRECTION

PATENT NO. : 7,463,080 B2  
APPLICATION NO. : 11/784293  
DATED : December 9, 2008  
INVENTOR(S) : Qingsheng Tan and Taylor Tan Page 1 of 1

It is certified that error appears in the above-identified patent and that said Letters Patent is hereby corrected as shown below:

IN THE SPECIFICATION

At column 2, line 61, please replace "105brespectively" with "105b respectively"

At column 3, line 15, please replace "1O5a" with "105a"

At column 3, line 19, please replace "1O5a" with "105a"

At column 3, line 29, please replace "1O5a" with "105a"

At column 3, line 37, please replace "105 b" with "105b"

At column 3, line 65, please replace "111bremains" with "111b remains"

Signed and Sealed this

Seventeenth Day of March, 2009

JOHN DOLL  
*Acting Director of the United States Patent and Trademark Office*